US010541099B1

(12) United States Patent
Gardner et al.

(10) Patent No.: US 10,541,099 B1
(45) Date of Patent: Jan. 21, 2020

(54) MAPPING AND MONITORING OF ELECTRICAL CONNECTIONS BETWEEN CIRCUIT BREAKERS AND LOADS

(71) Applicant: Amazon Technologies, Inc., Seattle, WA (US)

(72) Inventors: Brock Robert Gardner, Seattle, WA (US); Stephanie Towner, Seattle, WA (US); Brian Herman, Edmonds, WA (US)

(73) Assignee: Amazon Technologies, Inc., Seattle, WA (US)

( * ) Notice: Subject to any disclaimer, the term of this patent is extended or adjusted under 35 U.S.C. 154(b) by 94 days.

(21) Appl. No.: 15/636,030

(22) Filed: Jun. 28, 2017

(51) Int. Cl.
| H01H 71/04 | (2006.01) |
| H02J 9/06 | (2006.01) |
| H05K 7/14 | (2006.01) |
| H02B 1/04 | (2006.01) |
| G06F 1/3212 | (2019.01) |
| G06F 1/3296 | (2019.01) |

(52) U.S. Cl.
CPC .......... *H01H 71/04* (2013.01); *G06F 1/3212* (2013.01); *G06F 1/3296* (2013.01); *H02B 1/04* (2013.01); *H02J 9/061* (2013.01); *H05K 7/1492* (2013.01); *H01H 2231/002* (2013.01)

(58) Field of Classification Search
CPC .............. H01H 71/04; H01H 2231/002; G06F 1/3296; G06F 1/3212; H05K 7/1492; H02J 9/061; H02B 1/04

USPC .......................................................... 340/638
See application file for complete search history.

(56) References Cited

U.S. PATENT DOCUMENTS

| 6,195,243 | B1 | 2/2001 | Spencer et al. | |
| 2014/0177738 | A1* | 6/2014 | Alshinnawi | H04B 3/54 |
| | | | | 375/257 |
| 2015/0207301 | A1* | 7/2015 | Franks | H02H 3/006 |
| | | | | 361/634 |
| 2016/0363628 | A1* | 12/2016 | Hyun | G01R 31/333 |
| 2017/0125195 | A1* | 5/2017 | Sisley | H01H 71/04 |
| 2017/0131342 | A1* | 5/2017 | Meng | B60R 16/03 |
| 2017/0220092 | A1* | 8/2017 | Kodama | G06F 1/3287 |
| 2018/0284169 | A1* | 10/2018 | Kwan | G01R 31/327 |

\* cited by examiner

*Primary Examiner* — Hirdepal Singh
(74) *Attorney, Agent, or Firm* — Kilpatrick Townsend & Stockton LLP

(57) ABSTRACT

Techniques for monitoring statuses of electrical connections are described. In an example, an identifier of a circuit breaker is received. A determination may be made that the circuit breaker is in an "on" state based on the identifier of the circuit breaker being received. Further, an identifier of a load connected to the circuit breaker over a power cable is received. The identifier of the load is transmitted over the power cable. A determination may be made that the load is connected to the circuit breaker based on the identifier of the load being received. The identifier of the circuit breaker, the identifier of the load, and electrical connection statuses of the circuit breaker and the load may be provided over an interface.

20 Claims, 10 Drawing Sheets

MAPPING AND MONITORING OF ELECTRICAL CONNECTIONS BETWEEN CIRCUIT BREAKERS AND LOADS

BACKGROUND

A datacenter houses a collection of computer servers and associated components, such as network hardware (e.g., switches or routers). The collection of computer servers is often called a "server cluster" or "server farm," and is designed to provide computing power beyond the capability of a single machine. Server farms are commonly used for cluster computing, web services, remote data storage, web hosting, and other services.

In a typical datacenter, the computer servers and network hardware are installed in racks. Power is provided to the racks through a power distribution system. Circuit breakers are commonly used across various points of the distribution system. A circuit breaker is typically connected to multiple loads, such as some of the servers or network hardware, and provides electrical protection to these loads. Depending on the complexity of the datacenter and the topology of the power distribution system, there can be a large number of circuit breakers, each protecting a large number of loads. Because of this large number of components, mapping the electrical connections between the circuit breakers and their loads and monitoring the statuses of such connections can be challenging.

BRIEF DESCRIPTION OF THE DRAWINGS

Various embodiments in accordance with the present disclosure will be described with reference to the drawings, in which.

DETAILED DESCRIPTION

Figure 1:
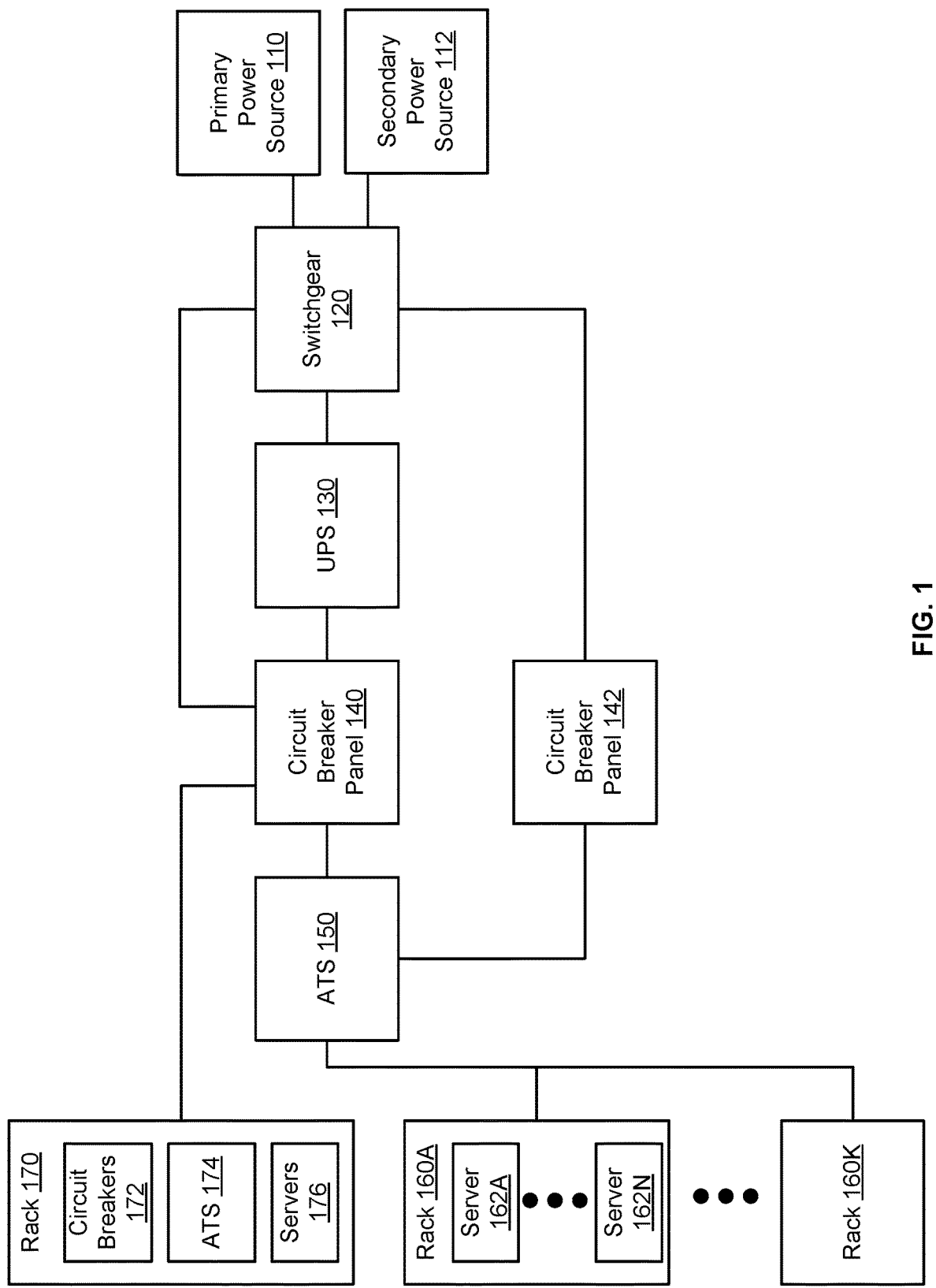
FIG. 1 is a block diagram of an illustrative datacenter environment including a power distribution system in accordance with at least some embodiments.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Various embodiments of the present disclosure are directed to, among other things, mapping electrical connections between the circuit breakers and their loads and monitoring statuses of such connections. In an example, power cables may connect electrical loads and circuit breakers. Identifiers of the loads and circuit breakers may be periodically transmitted in data messages over the power cables. The periodic transmission of an identifier of a component in a data message over a power cable (whether this component is a load or a circuit breaker) may represent a "heartbeat." A presence of a heartbeat may indicate that the component is electrically connected to the circuit breaker via the power cable and powered up. An absence of the heartbeat may indicate that the component is electrically disconnected from the circuit breaker. Accordingly, the heartbeats may be detected by monitoring the transmissions of the data messages over the power cables. The heartbeats may also be processed for status monitoring. For instance, the identifiers may be analyzed to pinpoint the components and determine whether certain electrical connections between the components should exist or not. Hence, the components, the connection statuses, and potential connection errors may be identified. Information, including alerts about the potential connection errors, may be generated and provided to an interface. An operator may access the information via the interface and initiate a corrective action as needed. This heartbeat-based analysis may be performed in real-time such that the mapping of the electrical connections and the monitoring of their statuses is kept up-to-date for the operator.

In an example, a load is connected to a circuit breaker over a power cable within a datacenter. For instance, the load may be a server computer installed in a rack of the datacenter. The circuit breaker may be one of many breakers belonging to a circuit breaker panel of the datacenter. On one side of this electrical connection, a smart plug may be connected to or integrated with the load. The smart plug may be configured to broadcast an identifier of the load over the power cable at a periodic broadcast interval. The circuit breaker may also be configured to append its identifier to the load's identifier. On another side of the electrical connection, a remote monitoring module may be connected to the circuit breaker. For instance, the connection monitoring module may be installed in-line with a power line that is distributed to the circuit breaker. This module may be configured to receive the two identifiers over the power line and process them to maintain a mapping of the electrical connection between the circuit breaker and the load and a status of this connection. Accordingly, if at some point, a heartbeat is received from the circuit breaker but does not contain the identifier of the load, the connection monitoring module may determine that the load has been electrically disconnected and may generate an alert about the disconnection. If the heartbeat is no longer received altogether, a determination may be made that the circuit breaker has been tripped and a corresponding alert may be generated. In yet another illustration, if the heartbeat contains an identifier of a load that should not be electrically connected to the circuit breaker, an alert may be generated about a faulty electrical connection between this particular load and the circuit breaker.

Many technical advantages may be attained by relying on the transmission and analysis of data messages over the power cables, where the data messages include identifiers of loads and circuit breakers as described in connection with the embodiments of the present disclosure. In an example and relative to existing systems, the mapping of electrical connections between loads and circuit breakers using the disclosed technologies may be more accurate, up-to-date, scalable, and maintainable. In contrast, existing systems typically rely on static labels that can be erroneously generated based on installation schematics and visual inspections of the electrical connections. In another example, the monitoring of connections statuses using the disclosed technologies may be performed in-real time and may more easily identify the loads and circuit breakers (and their locations) behind potential connection errors, including open connections and faulty connections. In contrast, existing systems may necessitate a search process (e.g., visual inspection) to identify a tripped circuit breaker and a review of the various connected loads thereto.

In the interest of clarity of explanation, various embodiments of the present disclosure are described in connection with a power distribution system of a datacenter. However, the embodiments are not limited as such. Instead, the embodiments similarly apply to any other type of a power distribution system that includes a number of circuit breakers electrically connected with a number of loads. Such a system may be associated with critical operations of a facility such as a power distribution system of a power utility, a hospital, or an airplane. Other power distribution systems may be non-critical and may include, for example, an entertainment system installed at a premise. Generally, a power distribution system may include a number of components to distribute power from one or more sources to one or more loads, where the components include one or more circuit breakers.

FIG. 1 illustrates an example of a power distribution system of a datacenter. The power distribution system may be configured to provide power from multiple sources to a plurality of racks. Using multiple power sources may allow, for example, for redundancy and for load balancing.

As illustrated, multiple power sources may be available and may include a primary power source 110 and a secondary power source 112. In an example, the primary power source 110 may be fed from a power utility through a public grid. In comparison, the secondary power source 112 may be fed from a same or different power utility, from a local power generation source, or from a battery backup system.

In an example, a power source may be used to provide power to a pod of racks, while the other power source may be used for redundancy. The size of a pod may vary between, for instance, two hundred fifty to three hundred fifty racks. In the illustrative example of FIG. 1, the pod includes racks 160A-10K and rack 170. To distribute power to the pod, the power distribution system may include switchgears, uninterruptible power supplies (UPS's), circuit breaker panels, circuit breakers, automatic transfer switches (ATS's), wiring, and other power distribution hardware.

To distribute power to the illustrated pod, a switchgear 120 may be connected to the power sources (e.g., the primary power source 110 and the secondary power source 112). The switchgear 120 may include switches, fuses, circuit breakers, and other electrical power components used to select one of and switch between the power sources and to control, protect, and isolate the downstream electrical components. A UPS 130 may be connected to the switchgear 120 and may be used as a backup power source if the switchgear 120 or the power sources become unavailable. Next, a circuit breaker panel 140 may be connected to both the switchgear 120 and the UPS 130. Power may be supplied to this panel 140 from the UPS 130 in a backup mode.

Generally, the circuit breaker panel 140 may include a number of circuit breakers. Each of the circuit breakers may be connected to a number of loads that draw electrical power, such as to server computers, network hardware, ATS's, and other power loads. For instance, a set of circuit breakers from the circuit breaker panel 140 may be connected to an ATS 150. The ATS 150 may also be connected to another circuit breaker panel 142 that bypasses the UPS 130 and that is connected to the switchgear 120 for redundancy. The ATS 150 may include a number of transfer switches, each of which may switch between the power sources based on a number of factors (e.g., availability of a power source, load distribution, etc.).

Power may be distributed to some of the racks in the pod through the ATS 150. For example, the racks 160A-160K may be connected to the ATS 150. Accordingly, loads within these racks, such as server computers 162A-162N in the rack 160A may receive power from the ATS 150.

Nonetheless, power distribution to other racks of the pod may bypass the ATS 150. For example, the rack 170 may be directly connected to the circuit breaker panel 140. This connection may include a busway that electrically couples the equipment installed in the rack 170 to different power lines (e.g., three power lines A, B, and C, where each can selectively provide power from the power sources through the circuit breaker panel 140). In this case, the equipment installed in the rack 170 may include a number of circuit breakers 172 disposed between ends of the busway and the internal power wiring, an ATS 174 to switch between the power lines, server computers 176, and other electrical components (e.g., loads).

Hence, the power distribution system of the datacenter may be configured to distribute power from a plurality of power sources to a plurality of racks according to a particular topology. The topology of FIG. 1 is provided for illustrative purposes. Other topologies may be possible for a power distribution system.

Generally, the complexity of the topology increases with an increase to the number, type, and physical distribution of the electrical components, electrical connections, and electrical connection runs, among other factors. The distribution system includes circuit breakers at various levels of the topology. Each circuit breaker may be electrically connected with a number of loads. The number and type of loads may vary across the circuit breakers. Accordingly, mapping and monitoring electrical connections between the loads and the circuit breakers may become challenging. Likewise, when the power distribution system is scaled to accommodate changes to the number of racks or installed equipment or is updated after a maintenance event, the mapping and monitoring may become difficult too.

Figure 2:
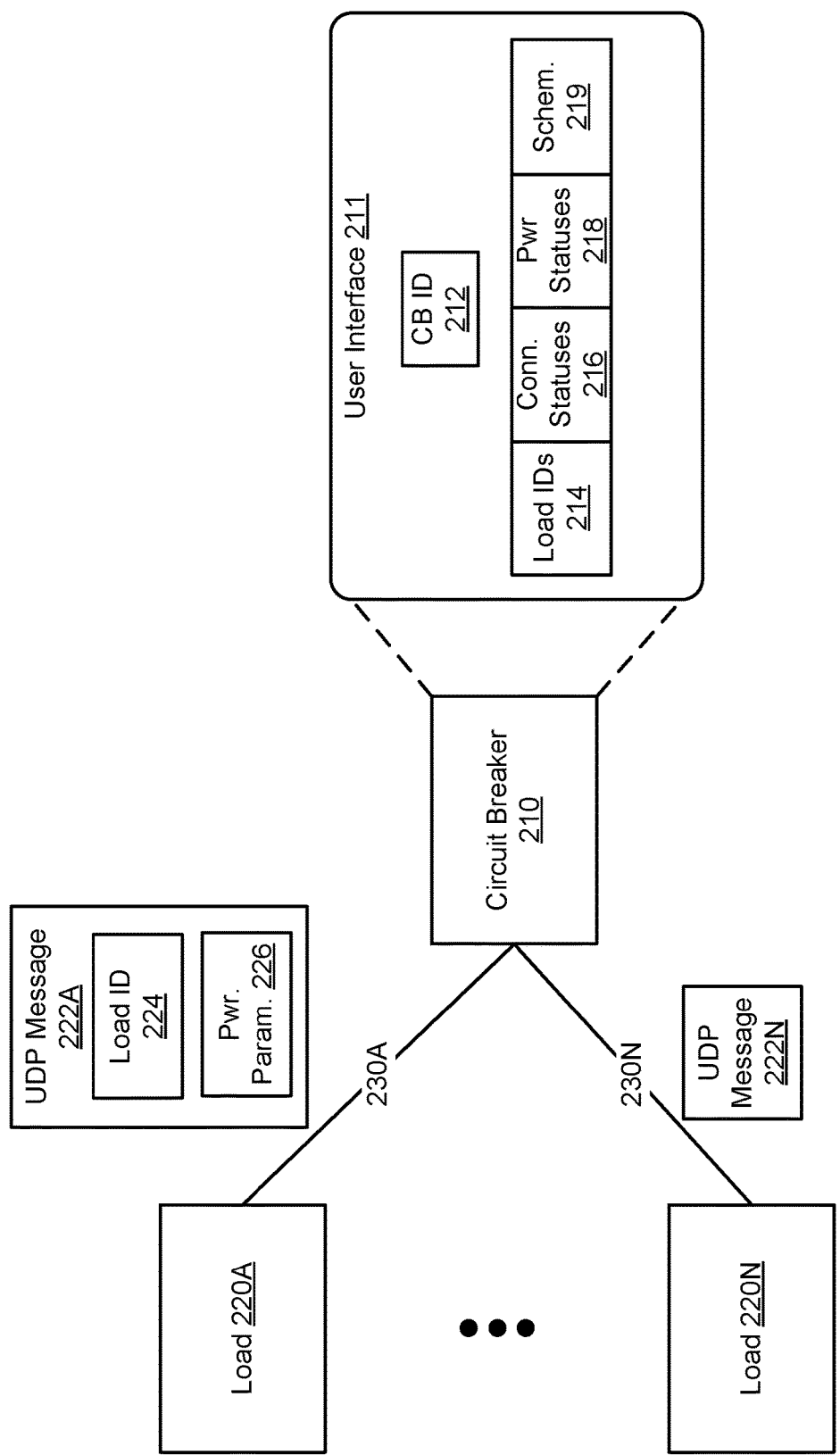
FIG. 2 illustrates example transmissions of data messages over power cables to identify loads in accordance with at least some embodiments.

FIG. 2 illustrates example transmissions of data messages over power cables to identify loads. As illustrated, a circuit breaker 210 may be connected to a number of loads 220A-220N over power cables 230A-230N. Data messages, shown in this particular embodiment as user datagram protocol (UDP) messages 222A-222N, may be transmitted from the loads 220A-220N to the circuit breaker 210 over the power cables 230A-230N. An interface may be provided for accessing electrical connection-related information based on the data messages.

As further described in connection with the next figures, each load may connect to or integrate a smart plug that transmits a data message to the circuit breaker 210 over a power cable. In an example, the transmission may be a broadcast performed repeatedly at a particular broadcast rate. For instance, the broadcast may rely on the UDP protocol. Examples of other protocols that can be used include transmission control protocol (TCP) or other transport layer protocols. Broadcasting the data message is one example of a type of transmission. Other types of transmission are possible. For instance, a polling mechanism may be used where the data message is transmitted in response to a request from the circuit breaker 210.

The data message, which may be referred to as a UDP message if the UDP protocol is used, may include an identifier of the load and, optionally, a number of power parameters. The identifier may uniquely identify the load, the physical location of the load, and/or the network address of the load. For example, within the context of a datacenter where the load is a server computer, the identifier may be a serial number or a name of the server computer, a physical location of the server computer within the datacenter, an identifier of a rack in which the server computer is installed, an installation position in the rack, an identifier of a power receptacle that the server computer is connected to in the rack, an internet protocol (IP) address of the server computer, and/or any other type of information that may uniquely identify the server computer. A power parameter may represent a parameter that indicates a power operation of the load. For instance, the power parameter may indicate a level of power consumption of the server computer (e.g., over-draw, normal draw, under-draw).

To illustrate, the load 220A is connected to the circuit breaker 210 over the power cable 230A. A UDP broadcast is used where the UDP message 222A is repeatedly broadcasted over the power cable 230A every one minute (or some other broadcast time interval). This broadcast may represent a heartbeat. The UDP message 222A may include a load identifier 224 that uniquely identifies the load 220A. Generally, this identifier 224 may not change. The UDP message 222A may also include a power parameter 226 that indicates the power consumption level of the load 220A and/or whether this consumption level changed since the last broadcast. A similar UDP message 222N may be broadcasted from the load 220N to the circuit breaker 210 over the power cable 230N that connects these two components.

The circuit breaker 210 may connect to or integrate a connection monitoring module, as further described in connection with the next figures, to support data message processing. In an example, data message processing may include addition of an identifier 212 of the circuit breaker 210, an analysis of the data messages, and the providing of the analysis to an interface.

As far as adding the identifier 212, the circuit breaker 210 may respond to a transmission of a data message from a load by augmenting this message or transmitting a new one. For instance, the circuit breaker 210 may add the identifier 212 to the data message or may transmit this identifier 212 in a separate data message. To illustrate, in response to the UDP message 222A from the load 220A, the circuit breaker 210 may append its identifier 212 to the load identifier 224. The identifier 212 may uniquely identify the circuit breaker 210, its physical location, the circuit breaker panel in which it is housed, its installation position within this panel, and/or the physical location of the panel.

As far as the analysis of the data messages, the outcome of the analysis may identify the loads electrically connected to the circuit breaker 210, the statuses of these connections, and/or power operations per load. Generally, the analysis may rely on the identifiers in the data messages to identify the connected components, on a connection list to validate that such components should be components and to identify any missing connections, and on a power operation list to validate the power operations. Errors may exist and may include a faulty connection (e.g., a load is identified as being connected to the circuit breaker 210 when it should not be connected), a missing connection (e.g., a load is identified as being disconnected from the circuit breaker 210 when it should be connected), or abnormal power operation (e.g., an over-draw or an under-draw of power by a threshold amount relative to a range of a normal power draw). Alerts about these errors may be generated by, for example, the circuit breaker 210 based on the circuit breaker's analysis of the data messages.

In one example, in response to a heartbeat from the load 220A, the load identifier 224 and the circuit breaker identifier 212 are detected in a data message. Accordingly, a determination may be made that an electrical connection exists between these two components. If the electrical connection is expected, the status of the electrical connection may be set to "normal," "available," or some other relevant indicator. Further, the power parameter 226 may be retrieved from the data message. If this parameter 226 corresponds to a normal power consumption, the power operation state may be set to "normal" or some other relevant indicator. Subsequently, if the heartbeat is no longer received, the status of the electrical connection may be set to "missing," "down," or some other relevant indicator.

Figure 3:
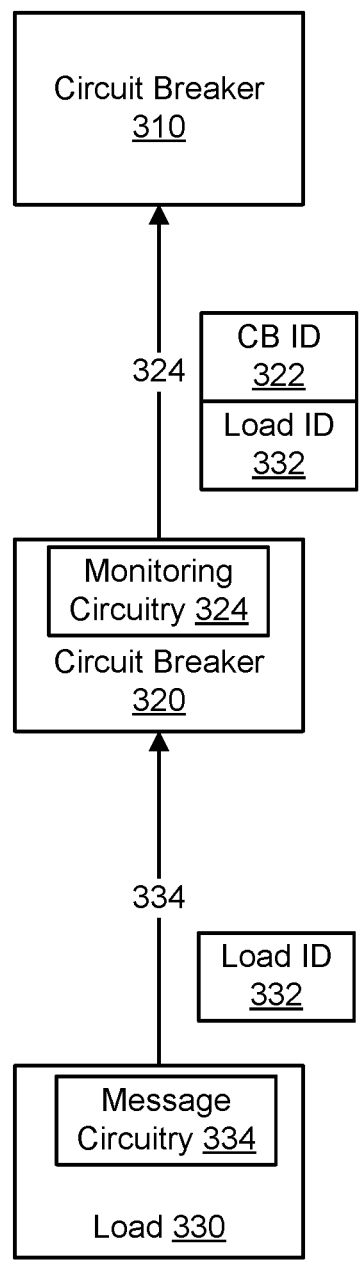
FIG. 3 illustrates an example of data messaging across multiple topology levels of a power distribution system in accordance with at least some embodiments.

The outcome of the analysis may be provided to, for example, a user interface 211 or may be available for transmission to a user device over a data interface. Such interfaces may be components of the connection monitoring module (whether integrated with or separate from the circuit breaker 210). As illustrated in FIG. 3, the user interface 211 may present various aspects of the analysis. The analysis results can also be provided to a remote or local computer system (not shown).

In an example, the user interface 211 may present the identifier 212 of the circuit breaker 210 and may list the various loads associated with the circuit breaker 210. For instance, the list may identify each load by presenting their identifiers 214, show their connection statuses 216 (e.g., whether a load is electrically connected or not and/or any associated connection errors or alerts), their power operation statuses 218 (e.g., whether a load is drawing the proper power or not). The list may also include links 219 to installation schematics. A link may represent a uniform resource location (URL) to a web page that includes the relevant installation schematic. This schematic may show the wiring diagram of an electrical connection to help troubleshoot any connection errors. For example, the user interface 211 may identify the load 220A, indicate that it is properly connected to the circuit breaker 210 and is drawing proper power, and may include a link to the installation schematic for the electrical wiring between the load 220A and the circuit breaker 210.

Hence, by transmitting data messages (whether via a heartbeat broadcast or based on a polling mechanism), electrical loads may be monitored and analyzed. In comparison to relying on a dedicated data cable or a wireless interface, by using the same power cable of an electrical connection for a transmission of a data message, the electrical connection may be monitored without the added complexity of data cables or wireless interfaces.

While FIG. 2 illustrates data messaging from loads to a circuit breaker, this messaging may be similarly performed across multiple topology levels of a power distribution system. For example, the data messaging may be unidirectional where the data messages may be broadcasted upstream. The upstream direction may refer to the inverse flow of power, where a first electrical component is upstream relative to a second electrical component if the power flows from the first electrical component to the second electrical component. In other words, the electrical load is "downstream" from a power source, and the power source is "upstream" from the electrical load.

FIG. 3 illustrates an example of data messaging across multiple topology levels of a power distribution system. Here, a first circuit breaker 310 is upstream to a second circuit breaker 320 that, in turn, is upstream to a load 330. In other words, the first circuit breaker 310 belongs to the highest topology level while the load 330 belongs to the lowest topology level. Of course another number of topology levels and other types of electrical components at each level can also be used.

In an example, the data messaging may flow in an upstream direction. A data message may be transmitted from the load 330 (e.g., via message circuitry 332, such as a smart plug) to the second circuit breaker 320 over the power cable 334 that connects these two components. The data message may include an identifier 332 of the load 330, among other information (e.g., a number of power parameters). Next, the second circuit breaker 320 (e.g., via message monitoring circuitry 324, as a connection monitoring module) may add its identifier 322 to the data message and transmit this updated data message to the first circuit breaker 310 over the power cable 324 that connects the two electrical components. In this way, the data message reaching the first circuit breaker 310 may include the identifiers 322 and 332 of the electrical components that are relatively downstream.

The complexity of the message circuitry 334 and the monitoring circuitry 324 can vary depending on the implementation. In one example, the message circuitry 334 may include a diode. If the load 330 is powered up, the diode may send a first low voltage signal over the power cable 324. Otherwise, the first low voltage signal may not be sent. The monitoring circuit 324 may also include a set of diodes. One diode of this set may send a second low voltage signal in response to the first low voltage signal from the message circuitry 324 and in response to the circuit breaker 320 being in an "on" state. This second low voltage signal indicates that the circuit breaker 320 and the load are connected. Another diode of the monitoring circuitry 334 may also send a third low voltage signal when the circuit breaker 320 is an "on" state but when the first low voltage signal is not received from the message circuitry 324. This third low voltage signal indicates that the circuit breaker 320 is in the "on" state and that the load is disconnected. Each of the three voltage signals can be set to predefined and unique voltage level (or voltage range) to allow identifications of the load 330 and the circuit breaker 320. For instance, the first, second, and third low voltage signals may be set to 0.1 V, 0.15, and 0.2 V. When the circuit breaker 310 receives a 0.15 V signal, the circuit breaker 310 determines that this voltage corresponds to the second voltage signal and, thus, the circuit breaker 320 and the load 330 are connected. When the circuit breaker 310 receives a 0.2 V signal, the circuit breaker 310 determines that this voltage corresponds to the third voltage signal and, thus, the circuit breaker 320 is in the on "state" and that the load 330 is disconnected. Other examples of the message circuitry 334 and the monitoring circuitry 324 are possible and can involve some more complex logic stored in memory and executed by a processor. An embodiment of this more complex message circuitry 334 is further shown in FIG. 5 as a smart plug 510. An embodiment of this more complex monitoring circuitry 324 is further shown in FIG. 6 as a connection monitoring module 610.

Across the various implementations of the message circuitry 334 and the monitoring circuitry 324, a data message received by an electrical component at a topology level may include identifiers (and, optionally, power parameters) of electrical components that are at lower topology levels (i.e., downstream) and that are electrically connected to the electrical component. This data message may be parsed to recognize the identifiers, perform a heartbeat-based analysis, and identify the electrical connections, their statuses, potential errors, and power-related operations. For example, at one point in time, a data message reaching the first circuit breaker 310 may be parsed to identify the second circuit breaker 320 and the load 330. Accordingly, a determination may be made that a first electrical connection exists between the first circuit breaker 310 and the second circuit breaker 320 and that a second electrical connection exists between the second circuit breaker 320 and the load 330. If a subsequent data message reaching the first circuit breaker 310 includes only the identifier 322 of the second circuit breaker 320, a determination may be made that the first electrical connection still exists and that the second electrical connection is down (e.g., the load 330 has been disconnected).

Various techniques may be possible to add an identifier to a data message that already includes another identifier. In an example, various low voltage signals can be used as previously described. In another example, more complex circuitry is used and allows data encoding. In this example, the identifier 322 of the circuit breaker 320 may be appended to the identifier 332 of the load 330. This appending may include separating with a special character and listing the identifier 322 at the end of the identifier 332. A processor may recognize the special character as the separation between the identifiers. To illustrate, the load 330 may be a server computer installed in a rack of a datacenter. Its identifier 332 may take the form of "server name-rack name-position in rack-connected rack receptacle." The identifier 322 of the circuit breaker 320 may take the form of "circuit breaker panel-circuit breaker position in panel." In some embodiments, the special character may be a "<." Accordingly, the data message sent from the second circuit breaker 320 may include the identifier "server name-rack name-position in rack-connected rack receptacle<breaker panel-circuit breaker position in panel."

Figure 4:
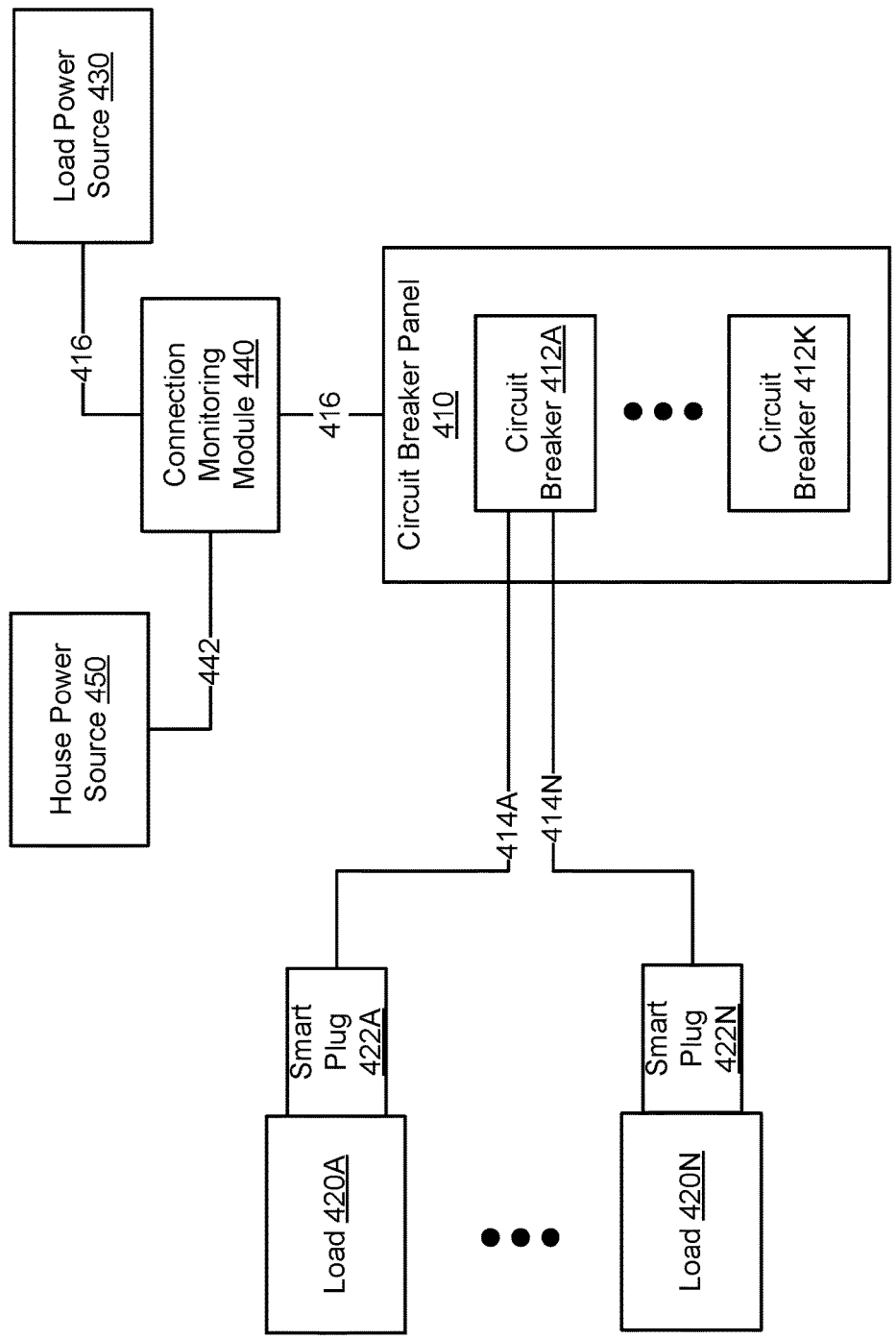
FIG. 4 illustrates an example installation of smart plugs and a connection monitoring module in accordance with at least some embodiments.

FIG. 4 illustrates an example installation of smart plugs and a connection monitoring module. Generally, a smart plug may represent an electrical connector, such as a male plug, that may be connected to a load in order to establish an electrical connection with another electrical component, such as a circuit breaker, over a power cable. One end of the smart plug may be connected to the load while another end may be connected to the power cable. The smart plug may also include hardware, firmware, and/or software to implement logic supporting the various functionalities of the present disclosure including the transmission of an identifier of the load over, for instance, the power cable. Although FIG. 4 illustrates smart plugs that are connected to but separate from the loads, any or some of the loads may integrate the corresponding smart plugs or functionally similar hardware. For example, the functionalities of a smart plug may be distributed between a receptacle, processor, memory, and a transmitter, among other components, of a server computer.

A connection monitoring module may be implemented on specialized hardware, or by firmware and/or software hosted on hardware. Generally, the connection monitoring module may be configured to analyzed messages from electrical loads and/or smart plugs to map electrical connections, identify their statuses, identify potential errors, generate alerts, determine power operation statuses, provide an interface, and/or transmit data messages in an upstream direction. Although FIG. 4 illustrates a connection monitoring module that is connected to but separate from circuit breakers, any or some of the circuit breakers may integrate the connection monitoring module. For example, such circuit breakers may be smart circuit breakers that include processors, memories, transceivers, and other components. The functionalities of the connection monitoring module may be distributed between such components of a smart circuit breaker.

As illustrated in FIG. 4, a circuit breaker panel 410 may include a number of circuit breakers 412A-412K. Each circuit breaker may be connected to a number of loads. For example, the circuit breaker 412A may be connected to multiple loads 420A-420N over power cables 414A-414N. Power may be supplied to the loads 420A-420N from a load power source 430 via the circuit breaker panel 410. For example, a power line 416 may be connected to the circuit breaker panel 410 and distributed among the circuit breakers 412A-412K. This power line 416 may electrically couple circuit breakers 412A-412K with the load power source 430.

In an example, a connection monitoring module 440 may be installed outside the circuit breaker panel 410. This module 440 may be installed in-line with the circuit breaker panel 410. For instance, the connection monitoring module 440 is connected to the power line 416. Further, the connection monitoring module 440 may be powered from a house power source 450 that is different from the load power source 430. For example, a power cable 442 may electrically couple the connection monitoring module 440 with the house power source 450. In this way, the connection monitoring module 440 may monitor data messages sent over the power line 416 without drawing power from the power line 416. The module's 440 availability may also be independent of the availability of the load power source 430.

Data messages may be sent from the smart plugs 422A-422N over the power cables 414A-414N. The circuit breaker 412A (and, similarly, the remaining circuit breakers) may add its identifier to data messages that it receives and pass the data messages to the power line 416. In turn, the connection monitoring module 440 may intercept the data messages and analyze them.

Although FIG. 4 shows a two-level topology (e.g., loads connected to circuit breakers), further embodiments can use a more complex topology. For instance, the power line 416 may be connected to an ATS, a circuit breaker, or another circuit breaker panel belonging to a higher topology level. Smart plugs and/or connection monitoring modules may exist at this higher topology level to facilitate the transmission and processing of data messages. In an example, a connection monitoring module receiving data messages from a lower topology level(s) (such as the module 440) may aggregate the received data messages into a single data message and may transmit this single data message forward. In this way, the total number of transmitted data messages may be reduced.

Generally, any of the components described here that send a data message over a power cable or a power line may rely on a power line communication (PLC) technology, such as power-line carrier communication (PLCC). At the physical layer, a low energy information signal may be superposed to the power wave. This information signal may encode the information of the data message. While the power wave is transmitted at 50 or 60 Hz (or some other frequency depending on the geographical region), the information signal may be transmitted at, for example, at 3 kHz, or at another frequency to avoid interference between the power wave and the data signal.

Different techniques may also be available for a circuit breaker to add its identifier to a data message. In one technique, the circuit breaker may be a smart circuit breaker and may be able to receive, process, and add its identifier to a data message, or to generate a new data message altogether. In another example technique, the circuit breaker may include electronic circuitry, such as diodes, resistors, capacitors, inductors, transformers, transistors, and/or integrated chips to detect the low energy information signal and add information that encodes the circuit breaker's identifier to the low energy information signal. In yet another technique, no changes may be made to the circuit breaker. Instead, a connection monitoring module may be installed between smart plugs and the breaker. This connection monitoring module may be dedicated to the circuit breaker and may monitor the incoming data messages, optionally aggregate the data messages, add the circuit breaker's identifier to the data messages or their aggregate, and forward the resulting data message(s) on the power cables (if not aggregated) or power line (if aggregated).

Figure 5:
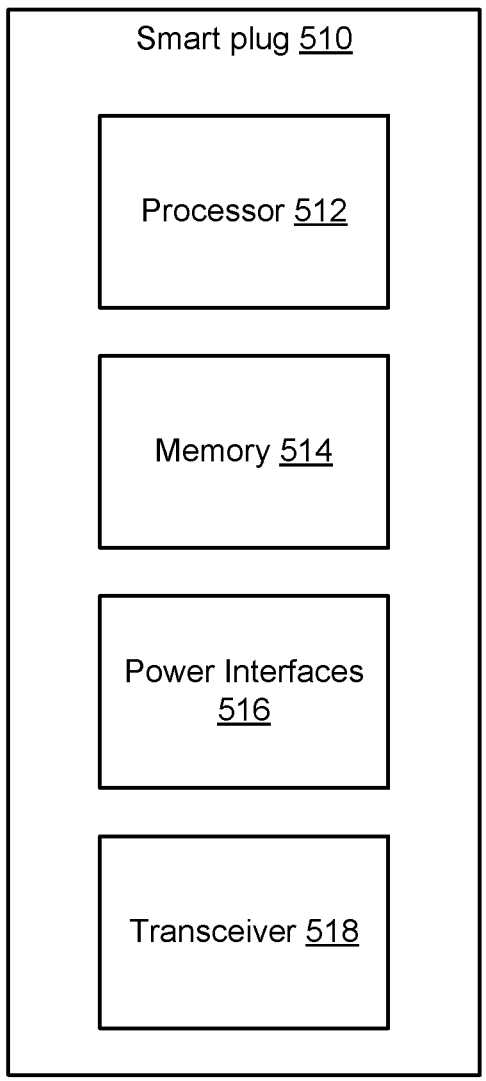
FIG. 5 illustrates an example configuration of a smart plug in accordance with at least some embodiments.

FIG. 5 illustrates an example configuration of a smart plug 510. The smart plug may include various components configured to access an identifier of a load and, optionally, a number of power parameters associated with the load, and to transmit data messages that include such information. The transmission may be periodic or on demand (e.g., by using a polling mechanism), a broadcast or bi-directional, and/or carried over a power cable. Generally, the smart plug 510 may take the form of a plug (e.g., an electrical connector) that includes additional components (relative to the electrical connector) for providing various functionalities.

Transmission over a data cable or a wireless transmission may be also possible. In this case, rather than relying on the power cable as the medium for transporting the data messages, the data cable or the wireless medium (e.g., air) may be used. Generally, this type of transmission may necessitate additional data components (such as data cables, data interfaces, etc.) and could be used as a back-up or supplementary method for transmitting the data messages.

In some embodiments, the components of the smart plug 510 may include a processor 512, a memory 514, power interfaces 516, and a transceiver 518. In an example, the memory 514 may represent a computer-readable storage medium that stores computer-readable instructions and that stores the identifier and power parameter(s). The processor 512 may be communicatively coupled with the memory 514 and the transceiver 518 over an interface bus. The processor 512, the memory 514, and the transceiver 518 may receive electrical power from a power source (not shown) internal to the smart plug 510. The power source may draw electrical power from the power cable connected to the smart plug 510 via the power interfaces 516 and/or from an internal battery. The processor 514 may execute the computer-readable instructions to provide various functionalities including accessing the identifier and power parameter(s) from the memory 514, generate a data message (e.g., at a periodic basis or in response to a request from a circuit breaker, the processor 514 may retrieve the identifier and, as applicable, power parameters from the memory 514 of the load and add this information to a payload of the data message), and pass the data message to the transceiver 518 for transmission. Depending on the type of transmission, the transceiver 518 may support PLC communications such that the data message may be sent over the power cable, and/or data communications such that the data message may be sent over the data cable and/or a wireless data interface. If a broadcast transmission is used, the transceiver 518 may need to only transmit the data message. In this case, the transceiver 518 may be a transmitter (rather a transmitter and a receiver).

The power interfaces 516 may include a set of electrical connectors for connecting the smart plug 510 to the load and to a power cable through which electrical power should be supplied to the load. For example, the power interfaces 516 may include a plug that may be inserted in a receptacle of the load and a receptacle that may receive a plug of the power cable. Electrical wiring (not shown) may exist between the power interfaces 516 (e.g., between the plug and the receptacle thereof) such that the electrical power flows through the smart plug 510.

Figure 6:
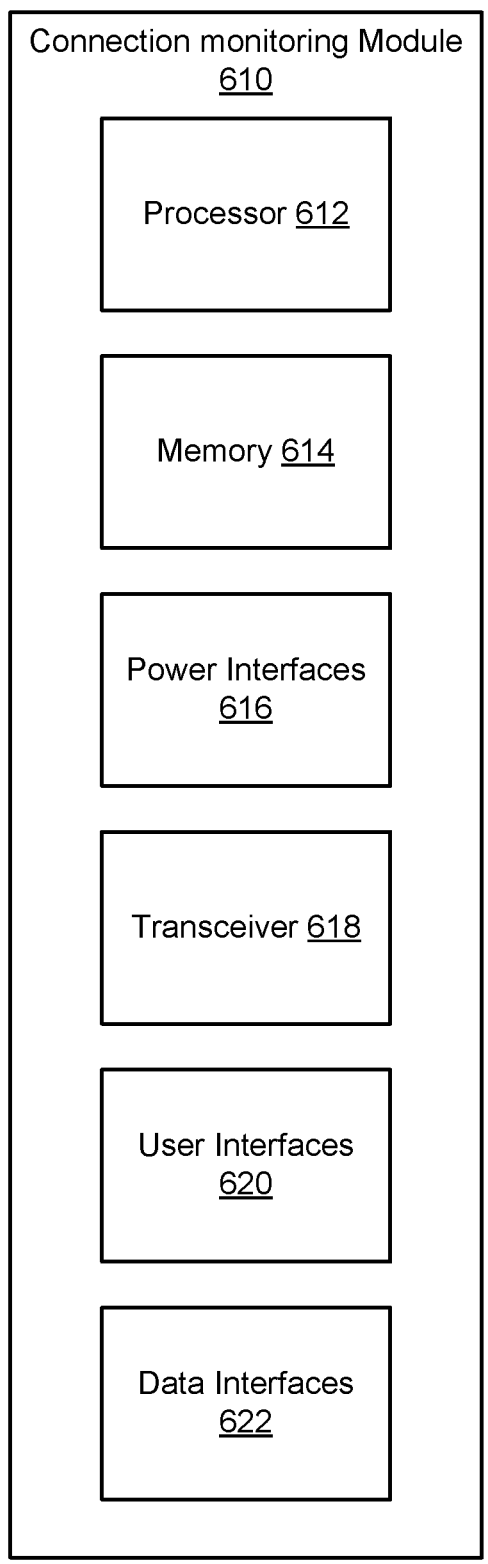
FIG. 6 illustrates an example configuration of a connection monitoring module in accordance with at least some embodiments.

FIG. 6 illustrates an example configuration of a connection monitoring module 610. The connection monitoring module 610 may monitor electrical connections and, thus, may be an example of a connection monitor. Generally, the connection monitor may include various components configured to receive data messages, to perform a heartbeat-based analysis based on the information in the data messages in order to map electrical connections, identify their statuses, identify potential errors, generate alerts, determine power operation statuses, provide an interface, and/or aggregate and transmit data messages.

As illustrated, the components of the connection monitoring module 610 may include a processor 612, a memory 614, power interfaces 616, a transceiver 618, user interfaces 620, and data interfaces 622. The processor 612, memory 614, transceiver 618, user interfaces 620, and data interfaces 622 may be communicatively coupled over an interface bus. These components may also receive power from a power source (not shown) internal to the connection monitoring module 610. The power source may draw electrical power from the power line connected to the connection monitoring module 610 via the power interfaces 616 and/or from an internal battery. In an example, the memory 614 may represent a computer-readable storage medium that stores computer-readable instructions and that stores the monitored data messages and, connection lists, power operation lists, and various information associated with performing the heartbeat-based analysis. The processor 612 may execute the computer-readable instructions to provide various functionalities of the connection monitoring module 610, including the performance of the heartbeat-based analysis, and to control operations of the transceiver 618, user interfaces 620, and data interfaces 622. Depending on the type of transmission, the transceiver 618 may support PLC communications such that the data messages may be received and sent over power cables and power lines, and/or data communications such that the data messages may be received and sent over the data cables and/or wireless data interfaces.

The power interfaces 616 may include a set of electrical connectors for connecting the connection monitoring module 610 to electrical components and power cables or power lines. For example, and referring back to the example installation of FIG. 4, the power interfaces 616 may include a plug that may be inserted in a receptacle of the portion of the power line 416 outgoing to the circuit breaker panel 410. The power interfaces 616 may also include a receptacle that may receive a plug of the portion of the power line 416 incoming into the connection monitoring module 610 (or module 440 of FIG. 4). Electrical wiring (not shown) may exist between the power interfaces 616 (e.g., between the plug and the receptacle thereof) such that the electrical power flows through the connection monitoring module 610.

The user interfaces 620 may include various components to allow a user to access, request, or control particular functionalities of the connection monitoring module 610. For example, the user interfaces 620 may include a graphical user interface (GUI) implemented on a monitor of the connection monitoring module 610. The GUI may support touch screen operations to request and present the mapping of electrical connections, the various statuses, and alerts. In another example, the user interfaces 620 may include a set of light emitting diode (LED) lights. Colors and light patterns may be used to identify electrical connections and their statuses. For example, a particular color (e.g., red) may correspond to a particular load (e.g., a particular server computer). A solid red light may indicate that this load may be connected, while a flashing red light may indicate that his load may be disconnected.

The data interfaces 622 may include various components for transmitting the information related to the heartbeat-based analysis (e.g., the data messages, the outcome of the analysis) to a user computing device (e.g., a laptop, or tablet, or a remote monitoring computer system) and to receive updates (e.g., new connection lists and power operation lists) and commands (e.g., a request to upload the information) from the user computing device. For example, the data interfaces 622 may include an RJ-45 port and/or a wireless data interface.

Figure 7:
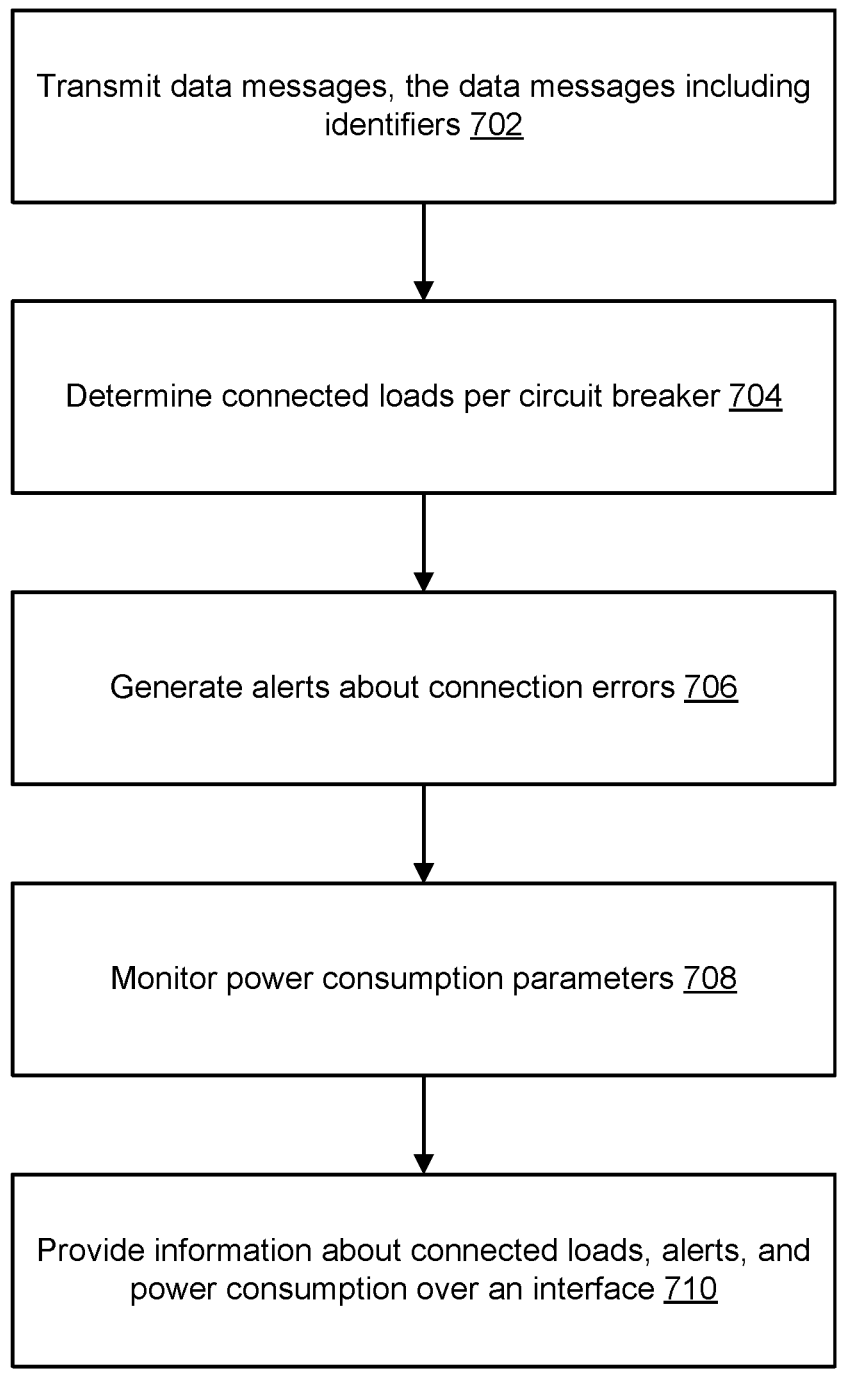
FIG. 7 illustrates an example flow for transmitting data messages, mapping the electrical connection based on such messages, detecting potential errors, and generating alerts in accordance with at least some embodiments.
Figure 8:
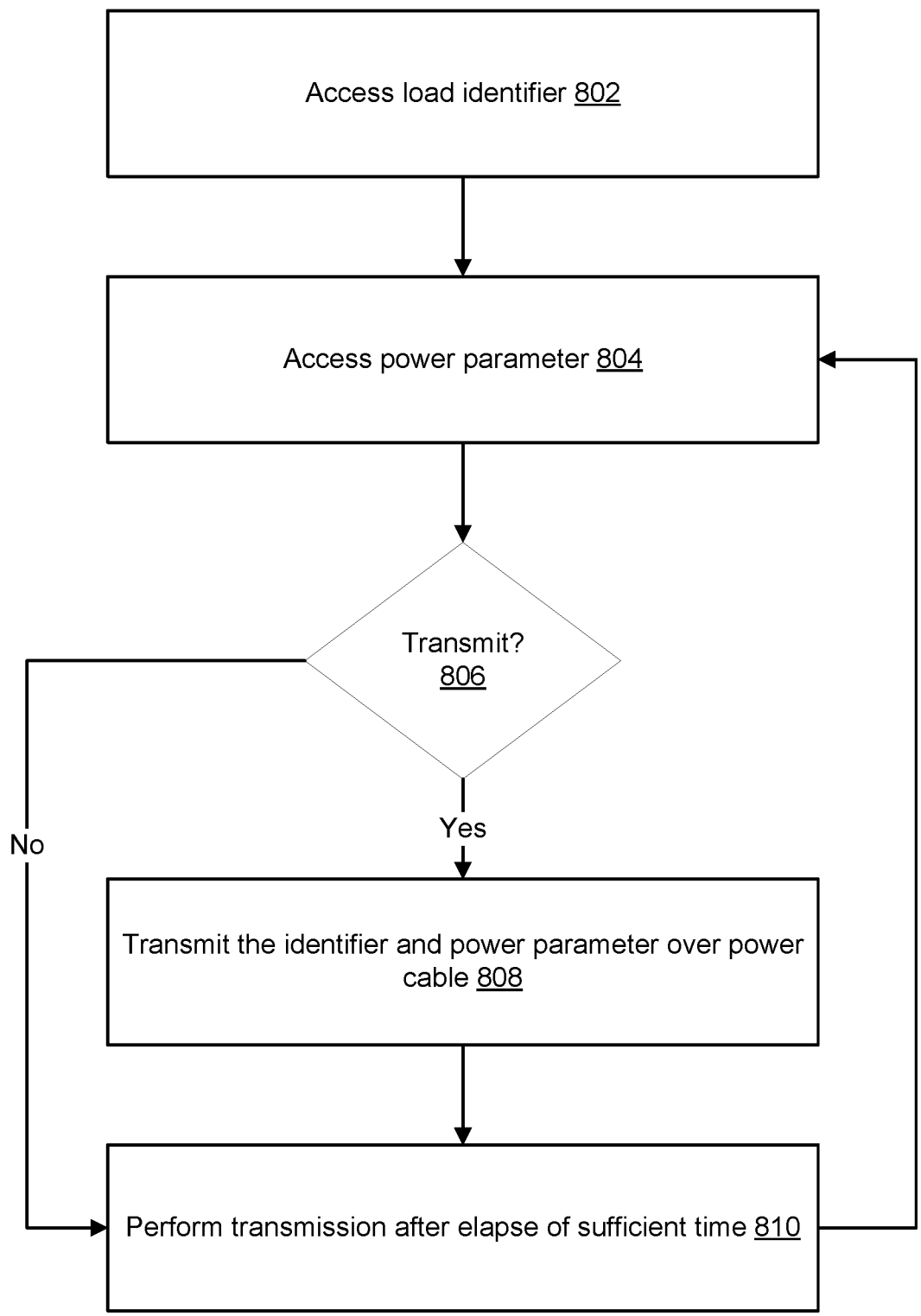
FIG. 8 illustrates an example flow for transmitting data messages associated with a load in accordance with at least some embodiments.
Figure 9:
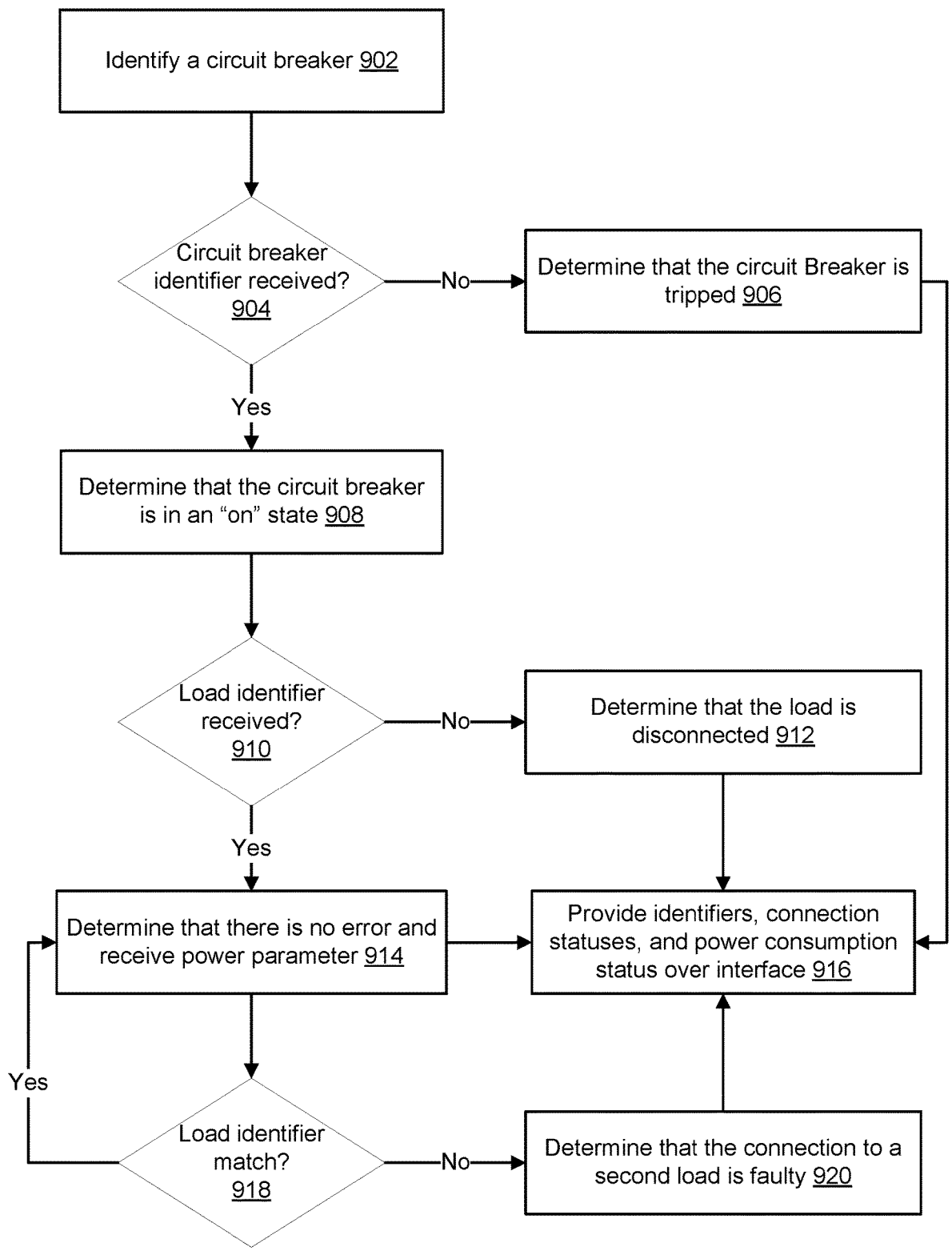
FIG. 9 illustrates an example flow for processing data messages to determine statuses of electrical connections between loads and a circuit breaker in accordance with at least some embodiments.

FIGS. 7-9 illustrate example flows for performing a heartbeat-based analysis. The operations of the flows may be performed by various computing components, such as by smart plugs, connection monitoring modules, and/or electrical components integrating or interfacing with smart plugs and/or connection monitoring modules. Although these operations may be described in connection with a smart plug and a connection monitoring module, they may be similarly implemented by other computing components. Further, while the operations are illustrated in a particular order, it should be understood that no particular order is necessary and that one or more operations may be omitted, skipped, and/or reordered.

FIG. 7 illustrates an example flow for transmitting data messages, mapping the electrical connection based on such messages, detecting potential errors, and generating alerts. The example flow may start at operation 702, where data messages may be transmitted. In an example, a data message may include an identifier of a load connected to a smart plug that, in turn, may connect the load to a circuit breaker over a power cable. The smart plug may transmit the data message in a UDP broadcast or other format over the power cable. Similarly, data messages may be transmitted from other loads or may be updated with additional identifiers and passed upstream by circuit breakers.

At operation 704, the connected loads may be determined for each circuit breaker. This determination may be based on the data messages. In an example, a connection monitoring module may be connected to a plurality of circuit breakers. This module may receive the data messages. Each data message may be parsed to recognize the identifiers therein. Typically, an identifier of a circuit breaker and an identifier of a load are present in a data message. The connection monitoring module may determine that an electrical connection exists between the two components and may update a mapping to list the two components, identify that an electrical connection exists between the two, and flag the status of this connection as "normal."

At operation 706, alerts about connection errors may be generated. These alerts may be based on the data messages. In an example, the connection monitoring module may compare the identifiers in each received data message to a connection list (as further described in connection with FIG. 9). This list may identify the expected electrical connections per circuit breaker. If a match exists between a set of identifiers (e.g., a load identifier and a circuit identifier) and the list, a determination may be made that there are no electrical connection errors. In this case, no alerts may be generated. However, if a mismatch exists or if one identifier is missing from the set, a determination may be made that there is an electrical connection error. Alerts corresponding to these errors may be generated.

Various errors may be possible, including disconnected loads, tripped circuit breakers, and/or faulty electrical connections. If the connection list identifies an electrical connection between a particular load and a particular circuit breaker, but the identifier of the load was not found in the data messages, the connection monitoring module may generate an alert that the load has been disconnected. On the other, if the connection list identifies a circuit breaker, but the identifier of the circuit breaker was not found in the data messages, the connection monitoring module may generate an alert that the circuit breaker has been tripped. Further, if an electrical connection between two components is detected based on a data message, but the list does not identify such a connection, the connection monitoring module may generate an alert that the electrical connection is faulty.

At operation 708, power consumption parameters may be monitored. The monitoring may be possible when the data messages include power parameters, such as ones indicating levels of power consumptions. In an example, the connection monitoring module may parse the data messages to identify the power consumption parameters. The connection monitoring module may further compare these parameters to a power operation list. This list may identify the expected power consumption range per load. If a parameter recognized for a load indicates a power consumption of a load that exceeds the corresponding power consumption range by a threshold amount, the connection monitoring module may generate an alert about an improper power consumption by the load. Otherwise, the connection monitoring module may flag the load as having an expected or normal power consumption.

At operation 710, information about the connected loads, alerts, and power consumption may be provided over an interface. For example, the connection monitoring module may provide the mapping, alerts, and power consumption statuses to an interface, such as to a user interface for presentation to a user or to a data interface for transmission to a user computing device.

FIG. 8 illustrates an example flow for transmitting data messages associated with a load. The example flow may start at operation 802, where an identifier of the load may be accessed. For example, a smart plug may be connected to the load. Because the identifier may be relatively static, the identifier may be stored in a memory of the smart plug. The smart plug may then access the identifier from the memory.

At operation 804, a power parameter may be associated with the power operation (e.g., power consumption) of the load. In an example, the smart plug may receive the power parameter from the load, when the parameter changes. If no power parameter is received within a timeframe, the smart plug may determine that there have been no changes thereto.

At operation 806, a determination may be made as to whether the load identifier and/or the power parameter should be transmitted. For example, the smart plug may be transmitting the load identifier, the power parameters, and/or the change to the power parameter in a periodic broadcast over an electrical power cable through which the electrical power is supplied to the load. The smart plug may compare the time point at which the last broadcast was sent to a broadcast time interval. If the difference between that time point and the current time point is equal to or larger than the broadcast time interval, the determination may be to perform the transmission. In this case, operation 808 follows operation 806. Otherwise, the determination may be to wait for additional time before the transmission and operation 810 follows operation 806. The broadcast time interval may be based on the criticality level of the load. Generally, the more critical the load is, the shorter the broadcast time interval may be. To illustrate, a first server computer of a datacenter may provide compute operations that have a higher criticality level than those of a second server computer of the datacenter. In this illustration, the broadcast time interval of the first server computer may be shorter than the one of the second server computer. In further embodiments, the determination to transmit the load identifier and/or the power parameter is made in response to receiving a polling signal.

At operation 808, the load identifier, the power parameters, and/or the change to the power parameter may be transmitted over the electrical power cable. For example, the smart plug may generate a data message that includes this information and may broadcast this message based on PLC communications.

At operation 810, the transmission may be performed after an elapse of sufficient time. For example, the smart plug may delay the transmission of the message until the difference between the current time point and the time point when the last transmission was performed is equal to or larger than the broadcast time interval. Thereafter, the smart plug may transmit the data message. Operation 804 may follow operation 810 for subsequent periodic broadcasts. Operation 802 may follow operation 810 instead if the identifier of the load changes.

FIG. 9 illustrates an example flow for processing data messages to determine statuses of electrical connections. This flow is described in connection with a load and a circuit breaker. However, the example flow similarly applies to a larger number and different types of electrical components that may be subject to monitoring by a connection monitoring module.

The example flow may start at operation 902, where a circuit breaker may be identified. For example, the connection monitoring module may be associated with (e.g., installed in-line with) a circuit breaker panel that houses the circuit breaker or installed in-line directly with the circuit breaker in a configuration where this module is dedicated to the circuit breaker. The connection monitoring module may store a connection list in its memory that identifies the circuit breaker (and, as applicable, other circuit breakers of the panel).

At operation 904, a determination may be made as to whether an identifier of the circuit breaker was received. For example, the connection monitoring module may monitor and parse different data messages to extract identifiers. The data messages may be received within a particular time frame. These identifiers may be compared to the connection list. If the identifier of the circuit breaker from the connection list is not found in the data messages received in the time frame, the connection monitoring module may determine that this identifier was not received. In this case, operation 906 follows operation 904, where the connection monitoring module may determine that the circuit breaker has been tripped. Operation 916 follows operation 906 and is further described herein below. If found in the list, the connection monitoring module may determine that the identifier was received. In this case, operation 908 follows operation 904, where the connection monitoring module may determine that the circuit breaker is in an "on" state.

At operation 910, a determination may be made as to whether an identifier of the load was received. For example, this identifier may be periodically broadcasted at a broadcast time interval. On the other hand, the connection checklist may identify the loads expected to be connected to the circuit breaker and, for each expected load, the last time point when its heartbeat was received and its broadcast time interval. Based on the connection list, the connection monitoring module may determine, for the load, the expected timing for receiving its identifier. The connection monitoring module may then monitor and parse data messages, if any, received during this expected time. If none of the extracted identifiers matches the identifier of the load, the connection monitoring module may determine that the load's identifier was not received. In this case, operation 912 follows operation 910, where the connection monitoring module may determine that the load is disconnected because its identifier was not found in any of the data messages (if any) received during the time interval corresponding to the expected broadcast of the identifier. Operation 916 follows operation 912 and is further described herein below. Otherwise, operation 914 follows operation 910.

At operation 914, the connection monitoring module may determine that there is no error with respect to the electrical connection between the load and the circuit breaker. The status of this connection may be updated accordingly in the connection list. Further, the connection monitoring module may extract the power parameter(s) of the load, if any, from the relevant data message. The parameter(s) may be used in conjunction with a power operation list to compare the actual power operation (e.g., power consumption) as indicated by the parameter(s) to the expected power operation as indicated by the power operation list. If there is a mismatch (e.g., a discrepancy in power consumption that exceeds a threshold amount, range, or level), the connection monitoring module may determine that the power operation of the load is improper and may update. The connection list may be updated to indicate this status of the power operation.

At operation 916, the connection monitoring module may provide the various identifiers (as extracted from the data messages), the identified electrical connections per circuit breaker, the status of each connection (e.g., whether a load has been disconnected or a circuit breaker has been tripped), and statuses of the power operations over an interface. This interface may present the information to a user and/or may upload the information to a user computing device along with the different monitored messages.

Further, when a power distribution system includes multiple topology levels and identifiers are appended to other identifiers between the topology levels, the connection monitoring module may enable a graph-like or tree-like presentation of the information. For instance, the interface may identify the loads connected to a circuit breaker at one topology level, the connection of the circuit breaker to another circuit breaker at a higher topology level, and other loads connected to this other circuit breaker.

Operation 918 may also follow operation 914. Operation 918 may be performed to detect faulty connections. In particular, identifiers extracted from data messages received at any point in time may be compared to the identifiers listed in the connection list. If an extracted identifier does not match any of the listed identifiers, the mismatch may indicate a faulty connection and operation 920 may be performed. Otherwise, no connection errors (e.g., faulty electrical connections) may exist and operation 914 may be followed. To illustrate, a data message may include an identifier of a second load and the identifier of the circuit breaker. Accordingly, the connection monitoring module may determine that an electrical connection exists between the second load and the circuit breaker. By comparing the identifier of the second load to the connection list, the connection monitoring module may determine that this identifier is missing from the list and, hence, the second load is not expected to be connected to the circuit breaker. In this case, at operation 920, the connection monitoring module may determine that the electrical connection between the second load and the circuit breaker is faulty. Operation 916 may be performed again to surface information about this connection (e.g., identify the second load and indicate a faulty status) to the interface.

In an example, the connection list and the power operation list may be sent to a connection monitoring module over the interface for storage in the memory of this module. In another example, one or both lists may be dynamically generated and maintained by the connection monitoring module. For example, the connection monitoring module may start with a blank connection list and, for some period of time, may monitor and analyze data messages to generate the mapping of the electrical connections and add this mapping to the connection list. For instance, a message may be received for a first time and may include an identifier of a particular load and an identifier of a particular circuit breaker. The remote connection module may add these identifiers to the connection list with an indication that a potential electrical connection exists between the two components. If the identifiers are persistently received in subsequent messages, the remote connection module may update the connection list to indicate that the electrical connection is an actual connection. The transmission rate of these data messages may also be measured. The connection list may be further updated to indicate the expected broadcast time interval for the particular load based on this measurement. A similar process may be followed to generate the power operation list. In this case, the power parameter(s) in the data messages may be monitored and analyzed to establish an average and an acceptable range relative to the average.

Figure 10:
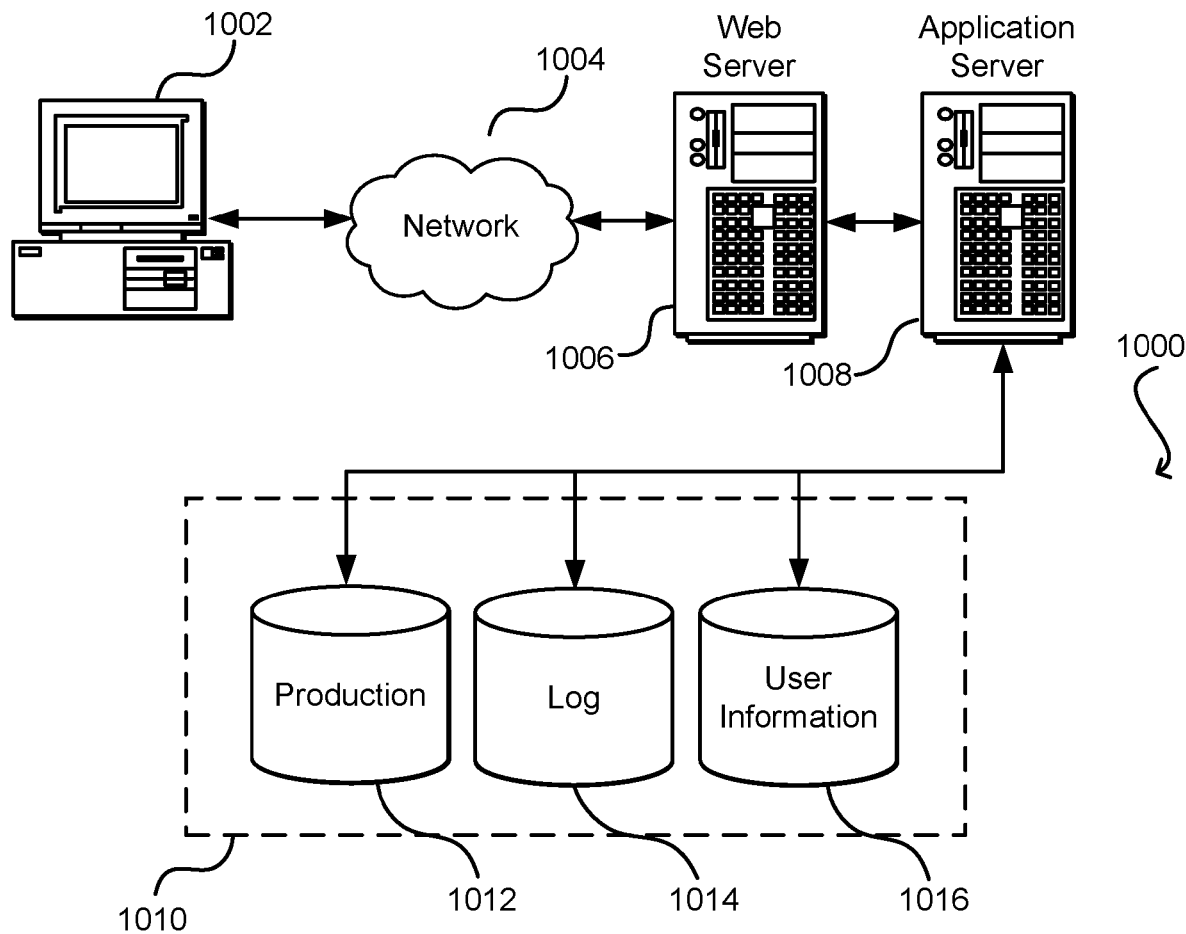
FIG. 10 illustrates an environment in which at least some embodiments can be implemented.

Turning to FIG. 10, the figure illustrates aspects of an example environment 1000 in which the above-described embodiments may be used. The environment 1000 may include example components that may be implemented within the datacenter of FIG. 1. These components include server computers, routers, network interfaces, and/or other computing and/or network equipment. The components may also include power distribution components to distribute electrical power to the computing and networking components. These power distribution components may include circuit breakers, smart plugs, and connection monitoring modules.

As will be appreciated, although a web-based environment is used for purposes of explanation, different environments may be used, as appropriate, to implement various embodiments. The environment includes an electronic client device 1002, which can include any appropriate device operable to send and receive requests, messages, or information over an appropriate network(s) 1004 and convey information back to a user of the device. Examples of such client devices include personal computers, cell phones, handheld messaging devices, laptop computers, set-top boxes, personal data assistants, electronic book readers, or any other computing device. The network(s) 1004 can include any appropriate network, including an intranet, the Internet, a cellular network, a local area network or any other such network or combination thereof. Components used for such a system can depend at least in part upon the type of network and/or environment selected. Protocols and components for communicating via such a network are well-known and will not be discussed herein in detail. Communication over the network can be enabled by wired or wireless connections and combinations thereof. In this example, the network includes the Internet, and the environment includes a web server 1006 for receiving requests and serving content in response thereto, although for other networks an alternative device serving a similar purpose could be used as would be apparent to one of ordinary skill in the art.

The illustrative environment includes at least one application server 1008 and a data store 1010. It should be understood that there can be several application servers, layers, or other elements, processes or components, which may be chained or otherwise configured, which can interact to perform tasks such as obtaining data from an appropriate data store. As used herein the term "data store" refers to any device or combination of devices capable of storing, accessing, and/or retrieving data, which may include any combination and number of data servers, databases, data storage devices and data storage media, in any standard, distributed or clustered environment. The application server can include any appropriate hardware and software for integrating with the data store as needed to execute aspects of one or more applications for the client device, handling a majority of the data access and business logic for an application. The application server 1008 provides access control services in cooperation with the data store 1010, and is able to generate content such as text, graphics, audio files and/or video files to be transferred to the user, which may be served to the user by the web server in the form of HTML, XML or another appropriate structured language in this example. The handling of all requests and responses, as well as the delivery of content between the client device 1002 and the application server 1008, can be handled by the web server 1006. It should be understood that the web and application servers 1006 and 1008 are not required and are merely example components, as structured code discussed herein can be executed on any appropriate device or host machine as discussed elsewhere herein.

The data store 1010 can include several separate data tables, databases or other data storage mechanisms and media for storing data relating to a particular aspect. For example, the data store 1010 illustrated includes mechanisms for storing production data 1012 and user information 1016, which can be used to serve content for the production side. The data store 1010 is also shown to include a mechanism for storing log data 1014, which can be used for reporting, analysis, or other such purposes. It should be understood that there can be many other aspects that may need to be stored in the data store 1010, such as for page image information and to access correct information, which can be stored in any of the above listed mechanisms as appropriate or in additional mechanisms in the data store 1010. The data store 1010 is operable, through logic associated therewith, to receive instructions from the application server 1008 and obtain, update or otherwise process data in response thereto. In one example, a user might submit a search request for a certain type of item. In this case, the data store might access the user information to verify the identity of the user, and can access the catalog detail information to obtain information about items of that type. The information then can be returned to the user, such as in a results listing on a web page that the user is able to view via a browser on the client device 1002. Information for a particular item of interest can be viewed in a dedicated page or window of the browser.

Each server typically will include an operating system that provides executable program instructions for the general administration and operation of that server, and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available, and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 10. Thus, the depiction of environment 1000 in FIG. 10 should be taken as being illustrative in nature, and not limiting to the scope of the disclosure.

The various embodiments further can be implemented in a wide variety of operating environments, which in some cases can include one or more user computers, computing devices or processing devices which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems and other devices capable of communicating via a network.

Most embodiments utilize at least one network that would be familiar to those skilled in the art for supporting communications using any of a variety of commercially-available protocols, such as TCP/IP, OSI, FTP, UPnP, NFS, CIFS, and AppleTalk®. The network can be, for example, a local area network, a wide-area network, a virtual private network, the Internet, an intranet, an extranet, a public switched telephone network, an infrared network, a wireless network, and any combination thereof.

In embodiments utilizing a web server, the web server can run any of a variety of server or mid-tier applications, including HTTP servers, FTP servers, CGI servers, data servers, Java servers, and business application servers. The server(s) may also be capable of executing programs or scripts in response to requests from user devices, such as by executing one or more web applications that may be implemented as one or more scripts or programs written in any programming language, such as Java®, C, C# or C++, or any scripting language, such as Perl, Python or TCL, as well as combinations thereof. The server(s) may also include database servers, including without limitation those commercially available from Oracle®, Microsoft®, Sybase®, and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network (SAN) familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch screen or keypad), and at least one output device (e.g., a display device, printer or speaker). Such a system may also include one or more storage devices, such as disk drives, optical storage devices, and solid-state storage devices such as RAM or ROM, as well as removable media devices, memory cards, flash cards, etc.

Such devices also can include a computer-readable storage media reader, a communications device (e.g., a modem, a network card (wireless or wired), an infrared communication device, etc.) and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services or other elements located within at least one working memory device, including an operating system and application programs, such as a client application or web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and computer-readable media for containing code, or portions of code, can include any appropriate media known or used in the art, including storage media and communication media, such as but not limited to volatile and non-volatile, removable and non-removable media implemented in any method or technology for storage and/or transmission of information such as computer-readable instructions, data structures, program modules or other data, including RAM, ROM, EEPROM, flash memory or other memory technology, CD-ROM, DVD, or other optical storage, magnetic cassettes, magnetic tape, magnetic disk storage or other magnetic storage devices or any other medium which can be used to store the desired information and which can be accessed by the system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as that included in the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z in order for each to be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate, and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A power distribution system within a datacenter, comprising:
   a server computer;
   a circuit breaker, the circuit breaker connected with a load over a power cable and connected to a power line;
   a plug connected with the load and the power cable, the plug comprising:
      a first processor, and
      a first memory storing an identifier of the load and first computer-readable instructions that, upon execution by the first processor, cause the plug to send the identifier of the load over the power cable; and
   a connection monitor connected with the circuit breaker and the power line, the connection monitor comprising:
      a second processor;
      a second memory storing second computer-readable instructions that, upon execution by the second processor, cause the connection monitor to:
         determine an identifier of the circuit breaker and identifiers of loads connected to the circuit breaker, the identifiers comprising the identifier of the load, the identifier of the circuit breaker and the identifiers of the loads received over the power line, and
         determine electrical connection statuses of the circuit breaker and the loads based on the identifier of the circuit breaker and the identifiers of the loads; and
      an interface configured to provide the identifier of the circuit breaker, the identifiers of the loads, and the electrical connection statuses.

2. The power distribution system of claim 1, wherein the power line is distributed to circuit breakers within a circuit breaker panel of the datacenter, wherein the connection monitor is connected to the circuit breakers over the power line and is powered from a power source independent of the power line.

3. The power distribution system of claim 2, wherein the second computer-readable instructions that, upon execution by the second processor, cause the connection monitor to maintain a list of connected loads per circuit breaker and respective electrical connection statuses based on respective identifiers.

4. The power distribution system of claim 1, wherein the interface comprises a user interface that is configured to present the identifier of the circuit breaker, the identifiers of the loads, and the electrical connection statuses, wherein the interface further comprises a data interface that is configured to transmit the identifier of the circuit breaker, the identifiers of the loads, and the electrical connection statuses over a data connection.

5. A computer-implemented method comprising:
   receiving, by a connection monitor, an identifier of a circuit breaker, the connection monitor electrically connected with the circuit breaker;
   determining, by the connection monitor, that the circuit breaker is in an "on" state based on the identifier of the circuit breaker being received;
   receiving, by the connection monitor, an identifier of a load that is connected with the circuit breaker over a power cable, the identifier of the load transmitted over the power cable by a plug, the load being electrically coupled with the power cable via the plug, the plug being configured to transmit the identifier as data based on a data communication protocol over the power cable;
   determining, by the connection monitor, that the load is connected to the circuit breaker based on the identifier of the load being received; and
   providing, by the connection monitor over an interface, the identifier of the circuit breaker, the identifier of the load, and electrical connection statuses of the circuit breaker and the load.

6. The computer-implemented method of claim 5, wherein the identifier of the load is broadcasted over the power cable from the plug, and wherein the identifier of the load and the identifier of the circuit breaker are received over a power line that connects the connection monitor and the circuit breaker.

7. The computer-implemented method of claim 6, wherein receiving the identifier of the circuit breaker comprises receiving a heartbeat in a data message, wherein the data message comprises the identifier of the circuit breaker appended to the identifier of the load, and wherein receiving the identifier of the load comprises accessing the identifier of the load from the data message based on a parsing of the data message.

8. The computer-implemented method of claim 5, further comprising:
   accessing a list that identifies loads expected to be connected to the circuit breaker;
   identifying a second load from the list;
   determining that an identifier of the second load was not received for a time period equal to or longer than a periodic broadcast time interval;
   determining that the second load is disconnected from the circuit breaker based on the identifier of the second load not being received; and
   generating a notification that the second load is disconnected.

9. The computer-implemented method of claim 5, wherein the identifier of the load is received at a first time point, and further comprising:
   maintaining a list that identifies the load, the circuit breaker, and an electrical connection status of the load as being connected to the circuit breaker;
   determining that the identifier of the load was not received at a second time point subsequent to the first time point by a time period equal to or longer than a periodic broadcast time interval;
   updating the electrical connection status of the load in the list to indicate that the load is disconnected from the circuit breaker; and
   generating a notification that the load is disconnected.

10. The computer-implemented method of claim 5, further comprising:
   receiving an identifier of a second load;
   determining that an electrical connection exists between the second load and the circuit breaker based on the identifier of the second load being received;
   accessing a list that identifies loads expected to be connected to the circuit breaker; and
   generating a notification that the electrical connection is faulty based on a determination that the list excludes the identifier of the second load.

11. The computer-implemented method of claim 5, wherein the identifier of the circuit breaker is received at a first time point, and further comprising:
   maintaining a list that identifies an electrical connection status of the circuit breaker as being on;

determining that the identifier of the circuit breaker was not received at a second time point subsequent to the first time point by a time period equal to or longer than a periodic broadcast time interval;

updating the electrical connection status of the circuit breaker in the list to indicate that the circuit breaker is tripped at the second time point; and generating a notification that the circuit breaker is tripped.

12. The computer-implemented method of claim 5, wherein the identifier of the load comprises an identifier of a rack of a datacenter, an installation position in the rack, and an identifier of a receptacle, wherein the load is installed in the rack and is connected to the power cable via the receptacle.

13. The computer-implemented method of claim 5, wherein the interface comprises a graphical user interface (GUI), and wherein providing the identifier of the circuit breaker, the identifier of the load, and the electrical connection statuses comprises presenting a physical location of the load, a name of the load, and a link to a schematic of an electrical connection between the load and the circuit breaker.

14. The computer-implemented method of claim 5, wherein the interface comprises a light emitting diode (LED) light, wherein a color of the LED light identifies the load, and wherein a flashing frequency of the LED light indicates an electrical connection status of the load.

15. The computer-implemented method of claim 5, wherein the identifier is received in a data message that is broadcasted over the power cable, wherein the data message further identifies a power parameter of the load, and further comprising:

determining a power consumption status of the load based on the power parameter; and providing, over the interface, the power consumption status.

16. The computer-implemented method of claim 5, wherein the circuit breaker belongs to a circuit breaker panel, wherein a power line connects the circuit breaker panel to the connection monitor and to an upstream circuit breaker, and further comprising: transmitting, by the connection monitor, the identifier of the load and the identifier of the circuit breaker over the power line to the upstream circuit breaker.

17. An apparatus comprising:
a circuit breaker;
a processor; and
a memory storing computer-readable instructions that, upon execution by the processor, cause the apparatus to:
receive an identifier of the circuit breaker;
determine that the circuit breaker is in an "on" state based on the identifier of the circuit breaker being received;
receive an identifier of a load that is connected with the circuit breaker over a power cable, the identifier of the load transmitted over the power cable by a plug, the load being electrically coupled with and the power cable via the plug, the plug being configured to transmit the identifier as data based on a data communication protocol over the power cable;
determine that the load is connected to the circuit breaker based on the identifier of the load being received; and
provide, over an interface, the identifier of the circuit breaker, the identifier of the load, and electrical connection statuses of the circuit breaker and the load.

18. The apparatus of claim 17, wherein the load comprises a server in a datacenter, and wherein the data communication protocol comprises a user datagram protocol (UDP).

19. The apparatus of claim 18, wherein the identifier of the load comprises at least one of: a name of the server, a physical location of the server, a network address of the server and is broadcasted in a UDP message.

20. The apparatus of claim 17, wherein the load provides compute operations associated with a criticality level, wherein the identifier of the load is received at a periodic broadcast time interval, and wherein the periodic broadcast time interval is based on the criticality level of the compute operations.

* * * * *

UNITED STATES PATENT AND TRADEMARK OFFICE
CERTIFICATE OF CORRECTION

| | |
|---|---|
| PATENT NO. | : 10,541,099 B1 |
| APPLICATION NO. | : 15/636030 |
| DATED | : January 21, 2020 |
| INVENTOR(S) | : Brock Robert Gardner, Stephanie Towner and Brian Herman |

Page 1 of 1

It is certified that error appears in the above-identified patent and that said Letters Patent is hereby corrected as shown below:

In the Claims

Column 24, Line 17, Claim 17:
Delete "the load being electrically coupled with and the"
Insert --the load being electrically coupled with the--

Signed and Sealed this
Nineteenth Day of May, 2020

Andrei Iancu
*Director of the United States Patent and Trademark Office*